United States Patent
Fransen et al.

(10) Patent No.: US 7,875,799 B2
(45) Date of Patent: Jan. 25, 2011

(54) ANGLED PATCH PANEL COVER PLATE

(75) Inventors: Robert E. Fransen, Homer Glen, IL (US); Mark J. Donnell, Orland Park, IL (US); Paul M. Herbst, Frankfort, IL (US); Jeremy S. Parrish, Mokena, IL (US)

(73) Assignee: Panduit Corp., Tinley Park, IL (US)

( * ) Notice: Subject to any disclaimer, the term of this patent is extended or adjusted under 35 U.S.C. 154(b) by 544 days.

(21) Appl. No.: 11/942,790

(22) Filed: Nov. 20, 2007

(65) Prior Publication Data

US 2008/0115956 A1 May 22, 2008

Related U.S. Application Data

(60) Provisional application No. 60/866,485, filed on Nov. 20, 2006.

(51) Int. Cl.
*H05K 5/03* (2006.01)
(52) U.S. Cl. .............................. 174/66; 174/67; 174/50; 439/540.1; 439/719
(58) Field of Classification Search .................. 174/66, 174/67, 50; 439/540.1, 534, 731, 541.5, 439/719, 43, 49, 532; 385/134, 135; 361/428, 361/429, 600, 601, 679.01; D13/184
See application file for complete search history.

(56) References Cited

U.S. PATENT DOCUMENTS

| | | | | |
|---|---|---|---|---|
| 6,866,541 | B2 * | 3/2005 | Barker et al. ............. | 439/540.1 |
| 7,094,095 | B1 * | 8/2006 | Caveney ................... | 439/540.1 |
| 7,207,835 | B2 * | 4/2007 | Levesque et al. .......... | 439/540.1 |
| D554,598 | S * | 11/2007 | Laursen et al. ............. | D13/184 |
| 7,300,308 | B2 * | 11/2007 | Laursen et al. ............ | 439/540.1 |
| 7,357,667 | B2 * | 4/2008 | Clark et al. ............... | 439/540.1 |
| 7,607,938 | B2 * | 10/2009 | Clark et al. ............... | 439/540.1 |
| 7,637,773 | B2 * | 12/2009 | Shifris et al. .............. | 439/540.1 |

OTHER PUBLICATIONS

Leviton Voice & Data Division Bulletin "Angled Patch Panel Accessories" Part Nos. 49254-BC1. 2004.*
Leviton Voice & Data Division Bulletin "Angled Patch Panel Accesories" Part Nos. 4W254-BC1. 2005.*
AMP NetConnect Catalog "Cover for Angled Patch Panels" Part No. 1499614-1, p. 49. 2009.*

* cited by examiner

*Primary Examiner*—Angel R Estrada
(74) *Attorney, Agent, or Firm*—Robert A. McCann; Christopher S. Clancy; James H. Williams

(57) ABSTRACT

A cover plate for an angled patch panel is described. The angled patch panel has a frame which has mounting members on opposite longitudinal ends of the frame, where the mounting members are for mounting the angled patch panel to a plurality of locations on a network rack. The frame has a longitudinal profile at least a portion of which is angled with respect to a line extending between the longitudinal ends of the frame to define an area bounded by the longitudinal profile and the line extending between the longitudinal ends of the frame. The cover plate for the angled patch panel includes a plate having a shape substantially the same as this area. Further, the cover plate includes a plurality of plate mounting members to mount the plate at the plurality of locations on the network rack.

42 Claims, 15 Drawing Sheets

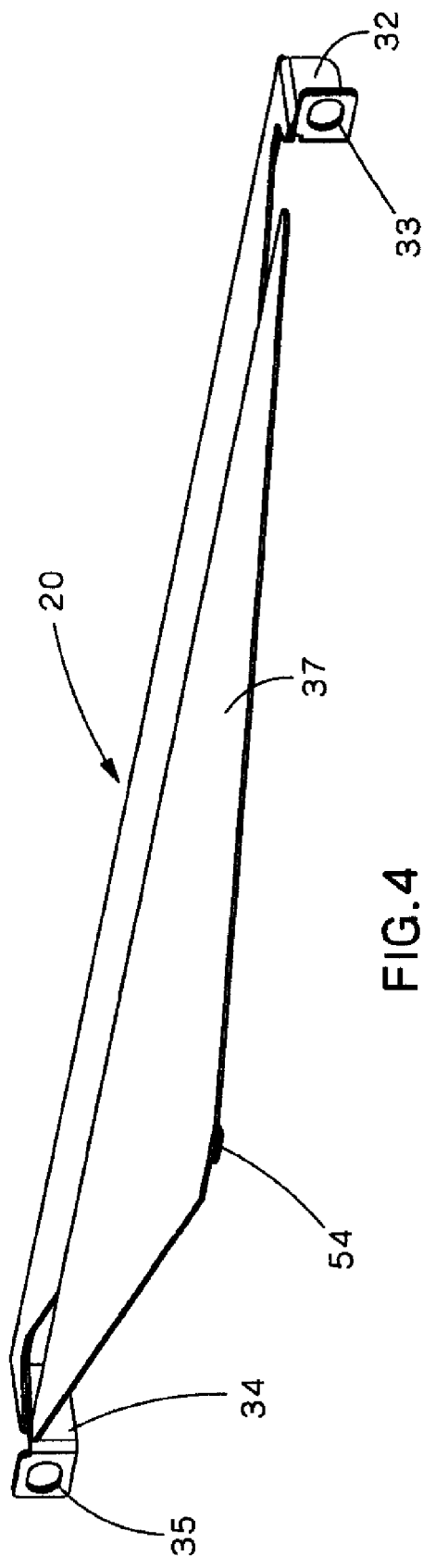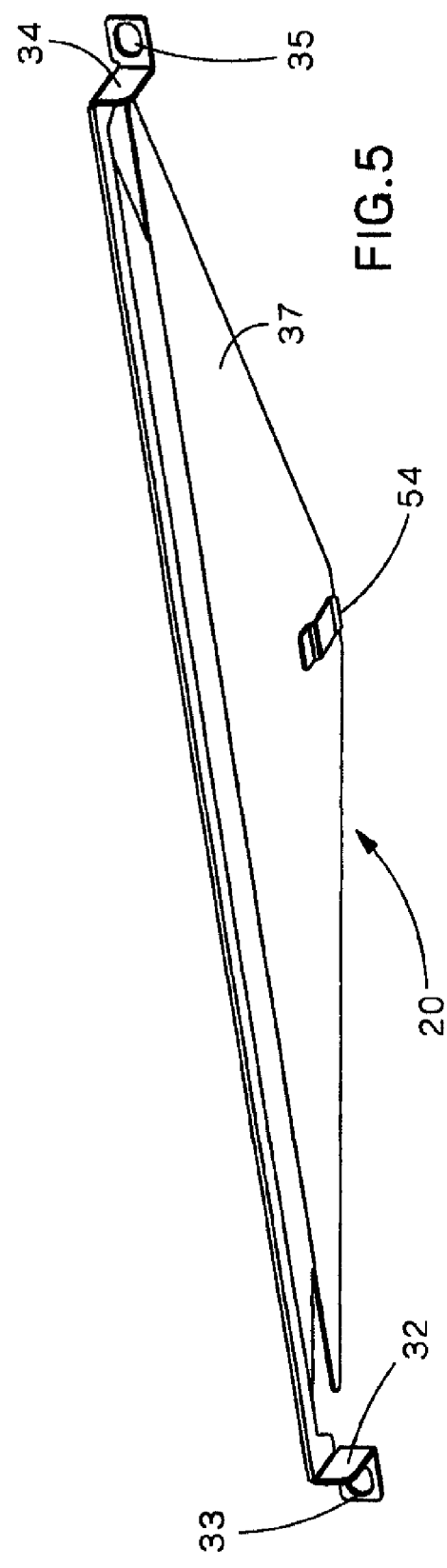

ANGLED PATCH PANEL COVER PLATE

CROSS-REFERENCE TO RELATED APPLICATION

The present patent application claims priority under 35 U.S.C. §119(e) to U.S. Provisional Patent Application Ser. No. 60/866,485, which was filed on Nov. 20, 2006, the full disclosure of which is incorporated herein by reference.

FIELD OF THE INVENTION

This invention relates to a cover plate for an angled patch panel and, more particularly, to a cover plate for an angled patch panel that utilizes zero rack units on a telecommunications equipment rack.

BACKGROUND

Telecommunications equipment racks use flat equipment, such as switches or flat patch panels, as well as angled patch panels. Transitional covers for angled patch panels, such as Leviton Part Nos. 49254-BC1 and 4W254-BC1, have been used to protect the panel termination field. These transitional covers occupy one rack unit above or below the angled patch panel. Thus, none of these prior transitional covers provide a zero rack unit solution.

SUMMARY

A cover plate for an angled patch panel is described. The cover plate is for an angled patch panel that has a frame which has mounting members on opposite longitudinal ends of the frame, where the mounting members are for mounting the angled patch panel to a plurality of locations on a network rack. The frame has a longitudinal profile at least a portion of which is angled with respect to a line extending between the longitudinal ends of the frame to define an area bounded by the longitudinal profile and the line extending between the longitudinal ends of the frame. The cover plate for the angled patch panel includes a plate having a shape substantially the same as this area. Further, the cover plate includes a plurality of plate mounting members to mount the plate at the plurality of locations on the network rack. Preferably, when the cover plate is mounted to the network rack, the cover plate substantially covers the area bounded by the longitudinal profile and the line extending between the longitudinal ends of the frame. Further, the shape of the plate of the cover plate may be various shapes depending on the longitudinal profile of the frame.

A network rack assembly including a network rack, an angled patch panel, and an angled patch panel cover plate is also described. The network rack has a front side and a rear side and the angled patch panel is mounted to the front side of the network rack. The angled patch panel cover plate includes a plate having an angled profile, where at least a portion of the angled profile is angled with respect to a line defined by the front side of the network rack. The cover plate further includes rack mounting members on opposite longitudinal ends of the plate and each rack mounting member includes a mounting aperture. The mounting members are mounted to the rear side of the network rack opposite to the front side of the network rack where the patch panel is mounted. The plate extends beyond a line defined by the front of the network rack and substantially covers the angled patch panel mounted to the front side of the network rack.

These as well as other aspects and advantages will become apparent to those of ordinary skill in the art by reading the following detailed description, with reference where appropriate to the accompanying drawings. Further, it is understood that this overview is merely an example and is not intended to limit the scope of the invention as claimed.

BRIEF DESCRIPTION OF THE DRAWINGS

FIG. 4 is a top front perspective view of the cover plate shown in FIG. 1;

FIG. 5 is a bottom rear perspective view of the cover plate of FIG. 4;

DETAILED DESCRIPTION

Figure 1:
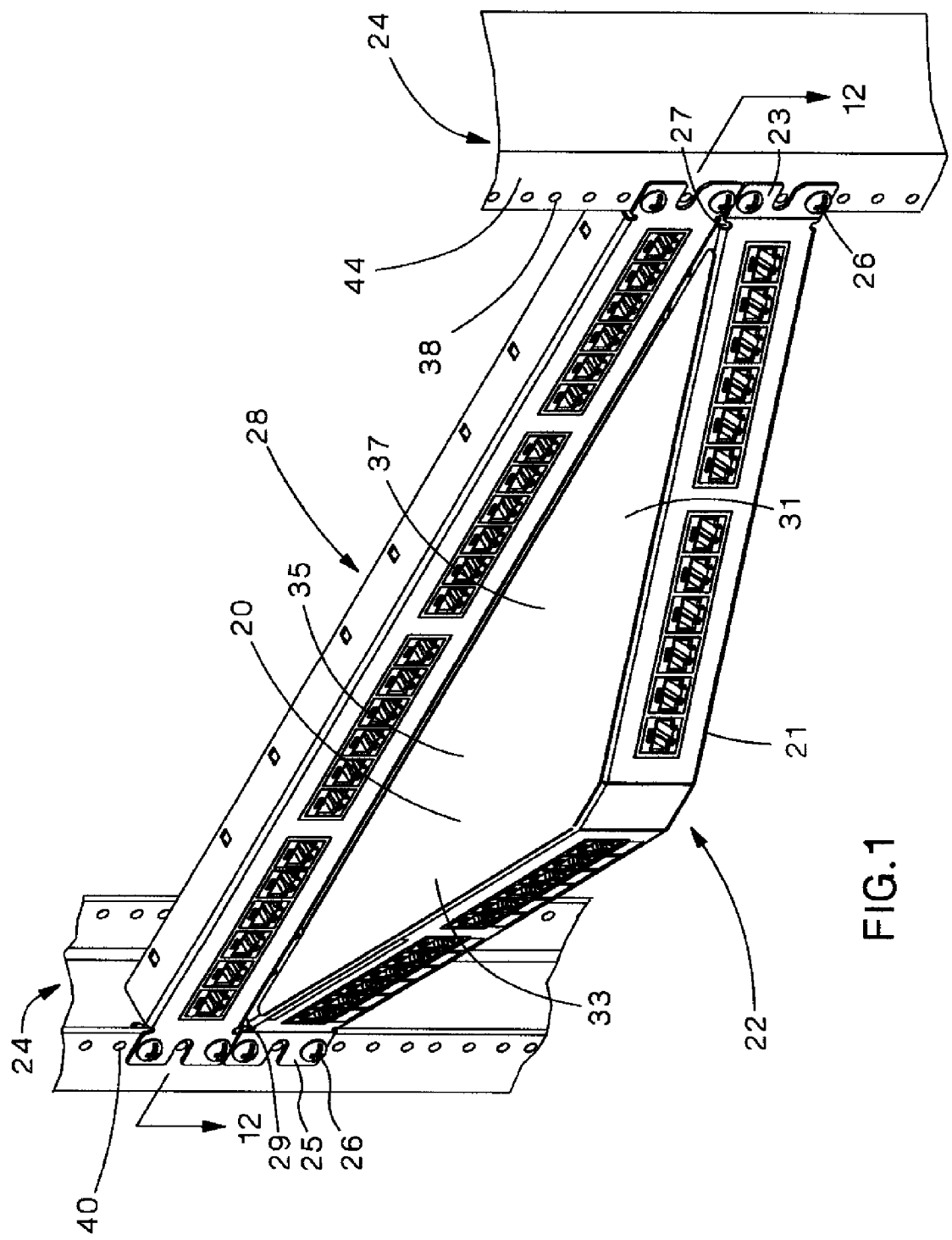
FIG. 1 is a top front perspective view of a cover plate according to the present invention, shown secured above an angled patch panel and below a flat patch panel.

FIGS. 1-18 illustrate a cover plate 20 for an angled patch panel. The angled patch panel may be an angled patch panel such as the angled patch panel disclosed in U.S. Pat. No. 6,866,541, owned by the Assignee of the present invention. Such an angled patch panel is depicted in FIG. 1 as angled patch panel 22. Alternatively, cover plate 20 may be used for an angled patch panel like the angled patch panel 200 illustrated in FIG. 16-17. Cover plate 20 may be used as a cover for other types of angled patch panels as well.

An angled patch panel, such as patch panel 22, may be secured to a network rack, such as rack 24. In a preferred embodiment, angled patch panel 22 is secured to rack 24 at a plurality of locations on rack 24. As shown in FIG. 1, angled patch panel 22 is secured to rack 24 using screws 26. Rack 24 has equidistantly-spaced mounting apertures 38, 40 positioned vertically therealong, which may receive screws 26. Angled patch panel 22 is secured to rack 24 at a plurality of these mounting apertures 38, 40. The angled patch panel 22 has a frame 21 and mounting members 23, 25 on opposite longitudinal ends 27, 29 of the frame. Screws 26 may be inserted through mounting members 23, 25 and through mounting apertures 38, 40 in order to secure angled patch panel 22 to rack 24.

Frame 21 of angled patch panel 22 has a longitudinal profile at least a portion of which is angled with respect to the line extending between the longitudinal ends 27, 29 of frame 21. For instance, portions of the longitudinal profile may be angled to form a substantially triangular shape, as shown in FIG. 1. Angled patch panel 22 has sections 31 and 33, both of which are angled with respect to the line extending between the longitudinal ends 27, 29 of the frame 21. Sections 31 and 33 together form a substantially triangular shape. There is an area 35 that is bounded by the longitudinal profile and the line extending between the longitudinal ends 27, 29 of the frame 21. Since the longitudinal profile of frame 21 is angled, the longitudinal profile of frame 21 may alternatively be termed an angled profile of frame 21.

In a preferred embodiment of the present invention, cover plate 20 includes a plate 37 that has a shape substantially the same as the shape of area 35. Therefore, cover plate 20 may have an angled profile with a shape substantially the same as the shape of area 35. Since the shape of plate 37 and area 35 is preferably substantially the same, it should be understood that the shape does not need to be exactly the same. For example, if the shape of area 35 is an equilateral triangle, the shape of the plate may be a substantially similar triangle with internal angles equal to 60 degrees, 59 degrees, and 61 degrees. Further, the cover plate does not necessarily have to cover the entire area 35. For example, plate 37 may cover a certain percentage of area 35 when the cover plate is installed. Alternatively, cover plate 37 may cover the entirety of area 35 and even extend beyond the angled profile frame of the patch panel. In addition to the examples discussed above, other variations in the shape of plate 37 and area 35 are possible as well.

Figure 2:
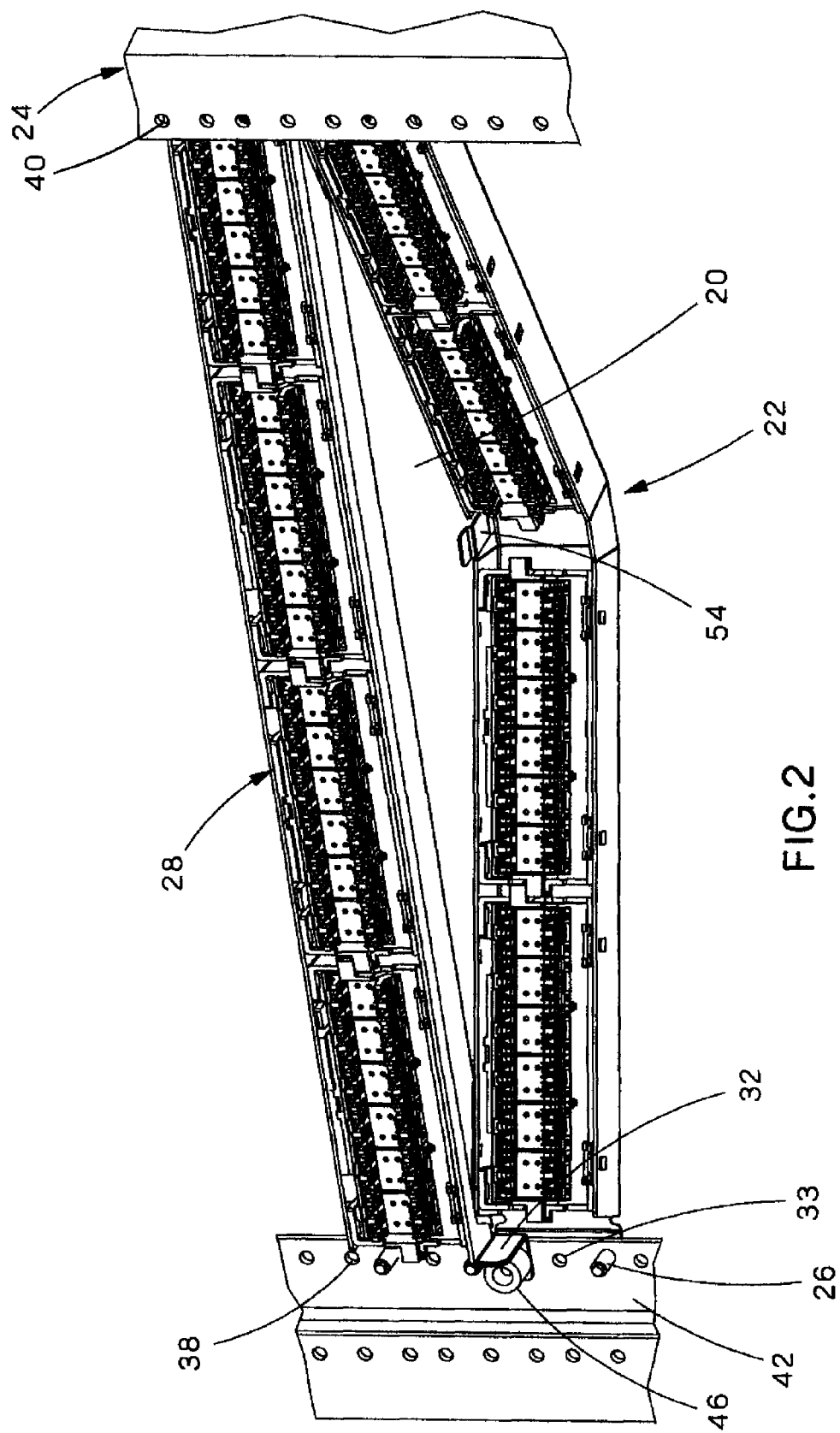
FIG. 2 is a bottom rear perspective view of the cover plate and patch panels of FIG. 1.
Figure 3:
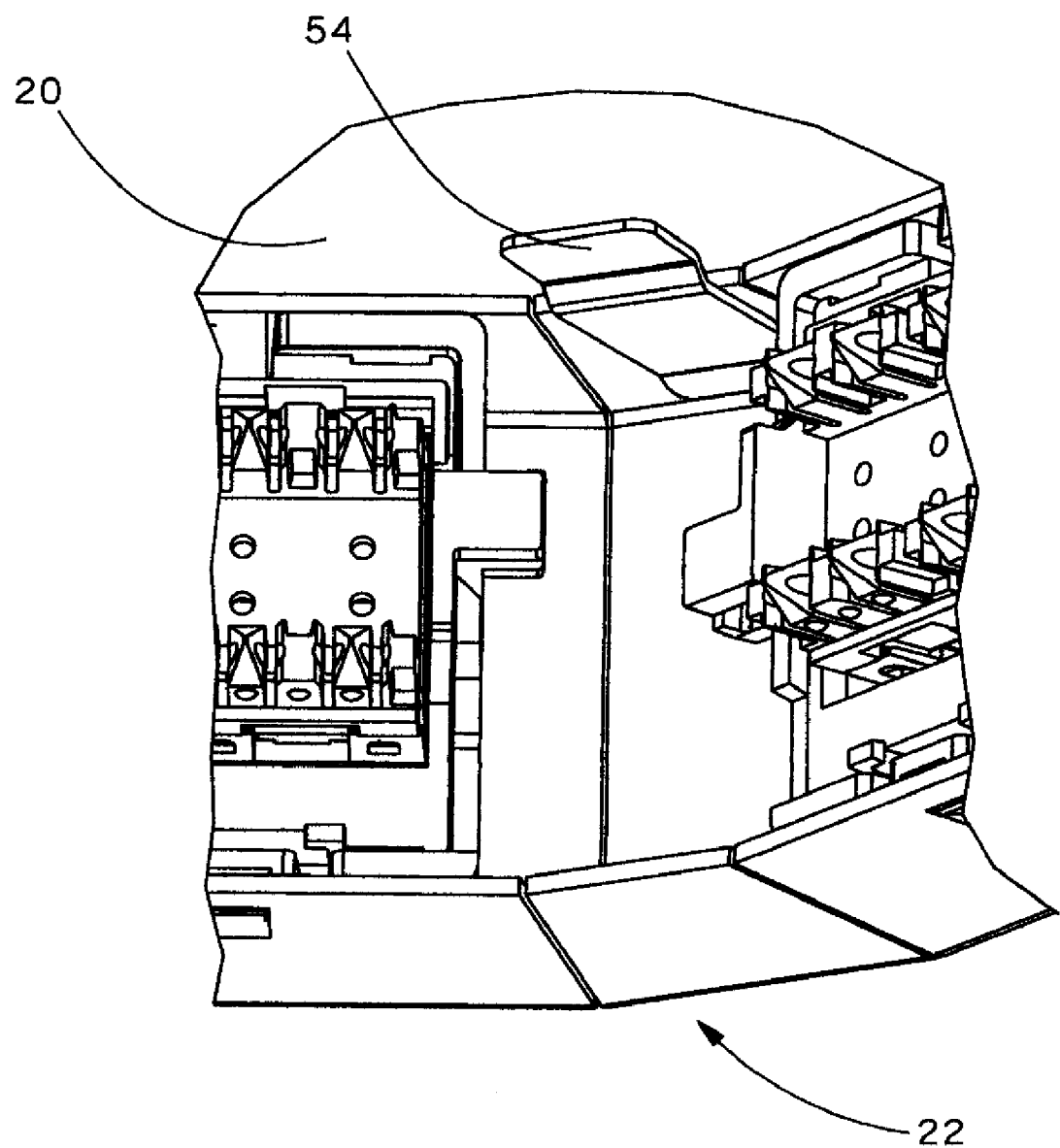
FIG. 3 is a detailed view of a portion of FIG. 2.
Figure 6:
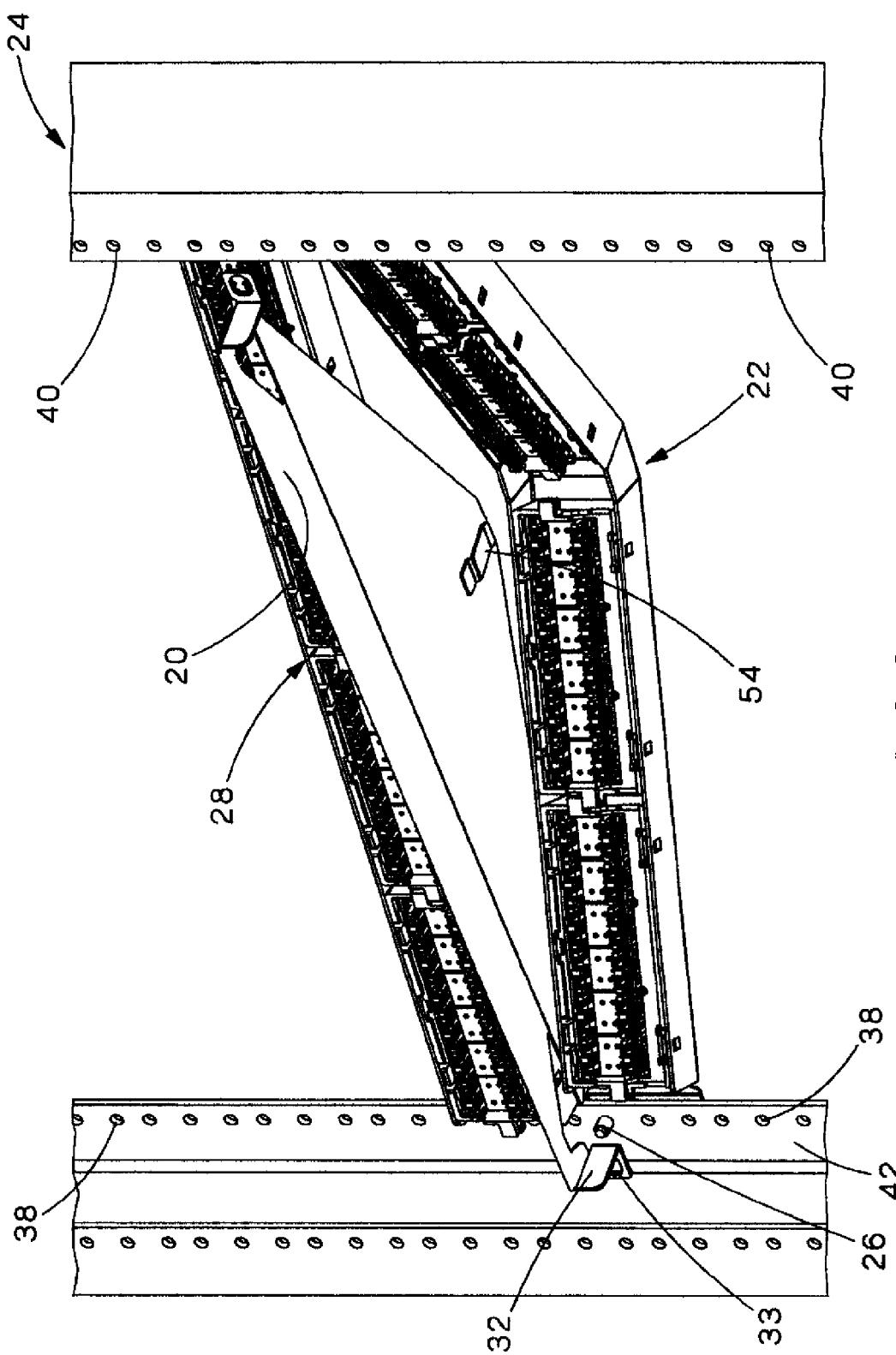
FIG. 6 is a bottom rear perspective view similar to FIG. 2, showing the cover plate before mounting to the angled patch panel.
Figure 7:
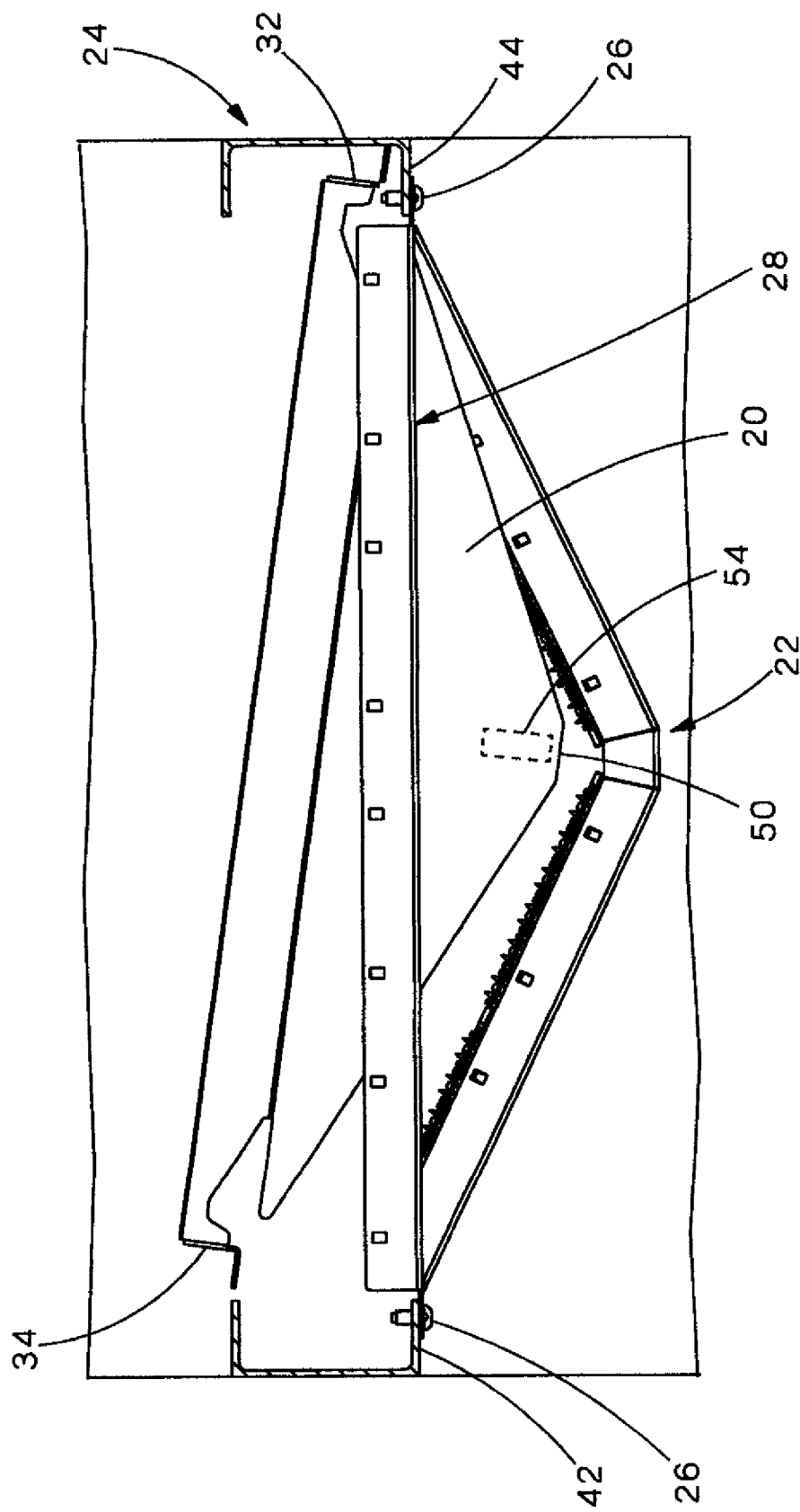
FIG. 7 is a top view of the cover plate and angled patch panel of FIG. 6.
Figure 8:
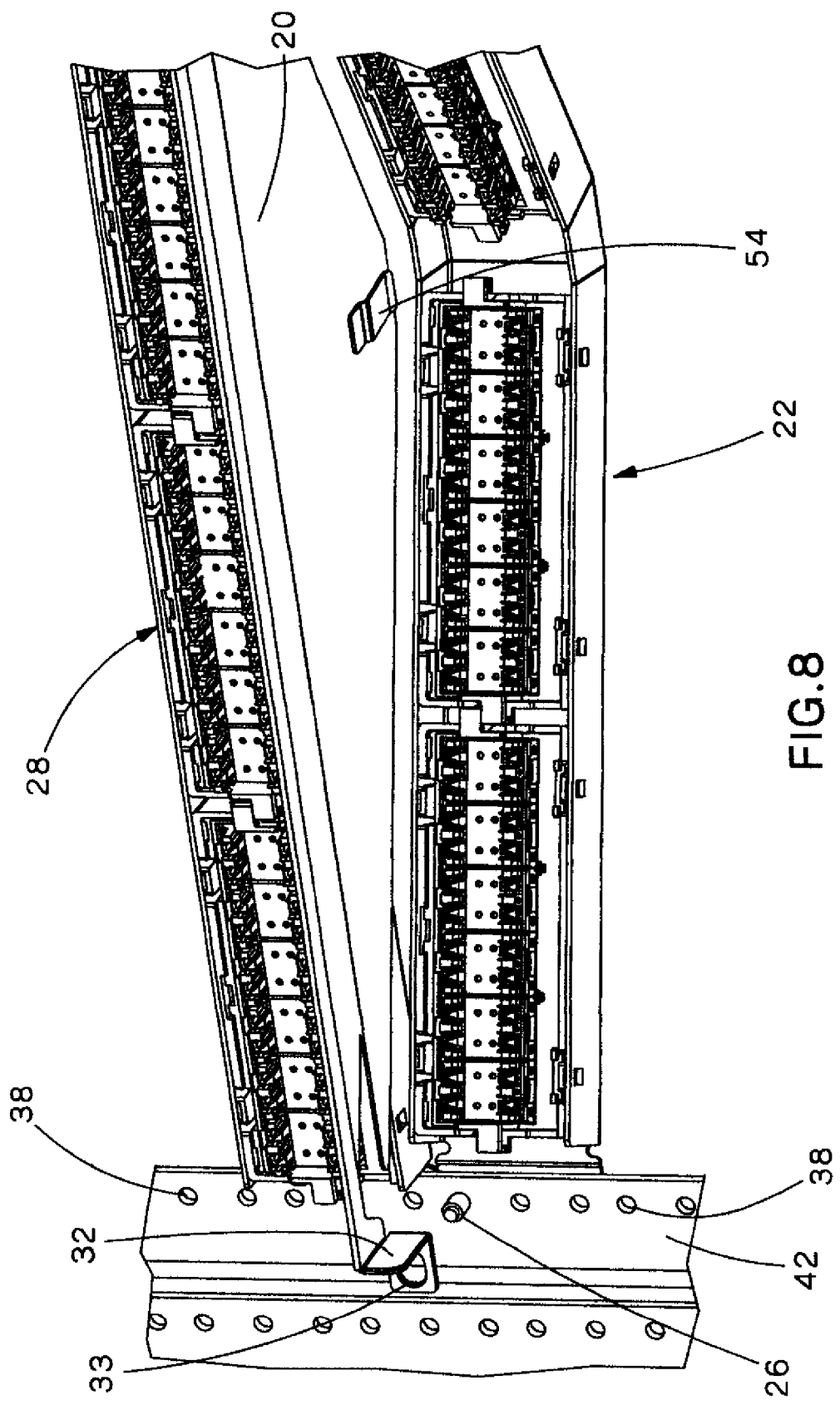
FIG. 8 is a bottom rear perspective view similar to FIG. 6, showing the cover plate before mounting to the angled patch panel.
Figure 9:
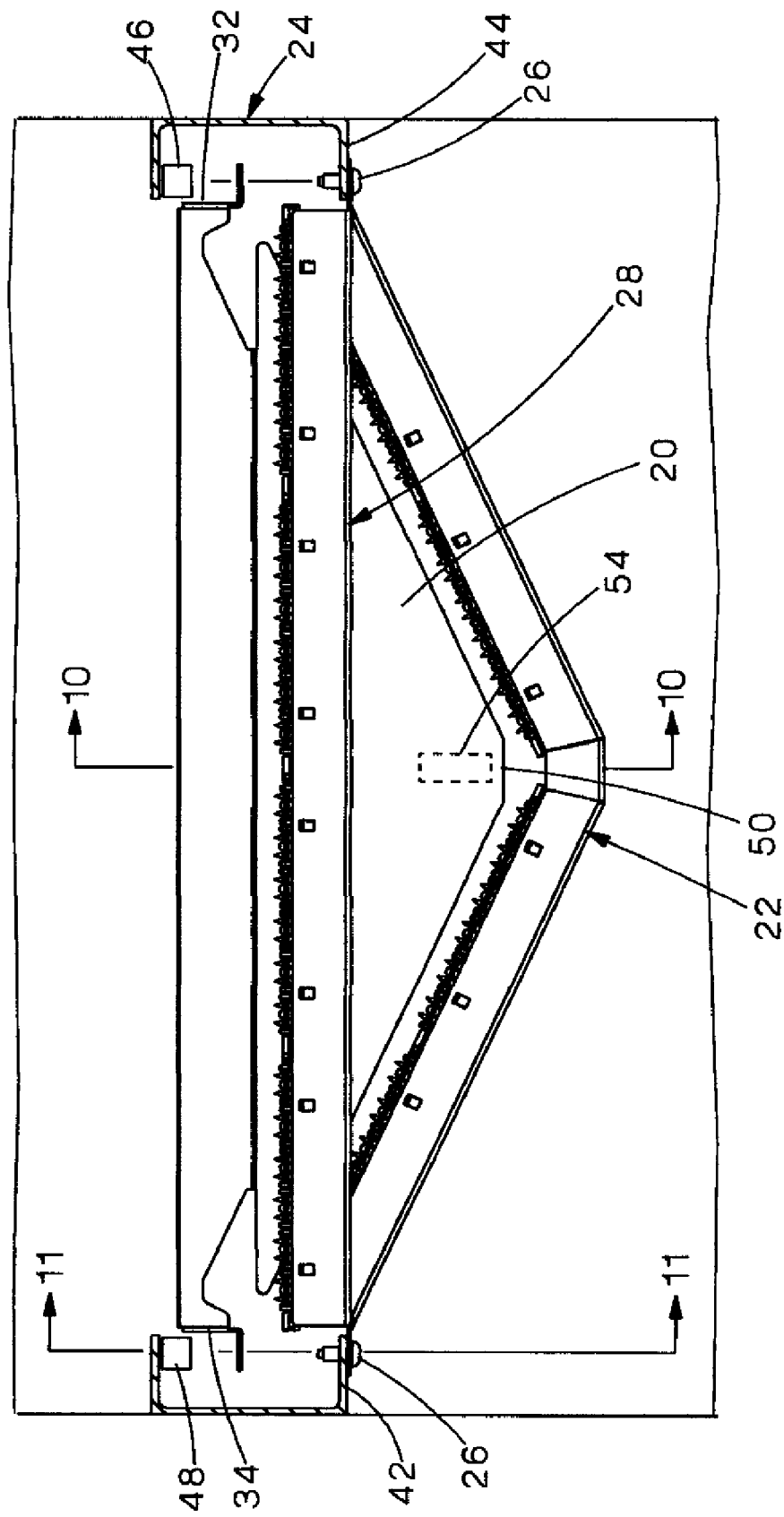
FIG. 9 is a top view of the cover plate and angled patch panel of FIG. 8.

As shown in FIGS. 1 and 2, cover plate 20 may be attached to the top of angled patch panel 22 and below flat patch panel 28. Alternatively, cover plate 20 may be flipped over and attached to the bottom of angled patch panel 22 and above another flat patch panel or switch. For example, if angled patch panel 22 occupied the top rack unit on rack 24, cover plate 20 may be used to cover the space below angled patch panel 22 and above a flat patch panel or switch. Although patch panels 22, 28 are shown occupying one rack unit each, each patch panel 22, 28 may occupy more than one rack unit.

Further, as best seen in FIGS. 4-5, cover plate 20 includes plate-mounting members 32, 34, with each plate-mounting member 32, 34 including a mounting aperture 33, 35, respectively. Plate-mounting members 32, 34 are preferably configured such that the cover plate 20 may be mounted on the rear side of a network rack that is opposite the front side of the network rack locations where an angled patch panel was mounted. For instance, mounting apertures 33, 35 may align with rack mounting apertures 38, 40, respectively, along rear side 42 of rack 24, and screws 26 inserted from front side 44 of rack 24 pass through mounting apertures 33, 35. In a preferred embodiment, retaining spacers 46, 48 are inserted over screws 26 to secure cover plate 20 to rack 24. Retaining spacers 46, 48 are secured to the uppermost screws 26 attaching patch panel 22 to rack 24, as best seen in FIG. 2. Alternatively, a nut may be screwed onto screws 26 in order to secure the cover plate to the network rack. Other securing mechanisms are possible as well, as are other mounting locations, such as on the same side of the network rack 24 as the angled patch panel 22 is mounted.

Figure 15:
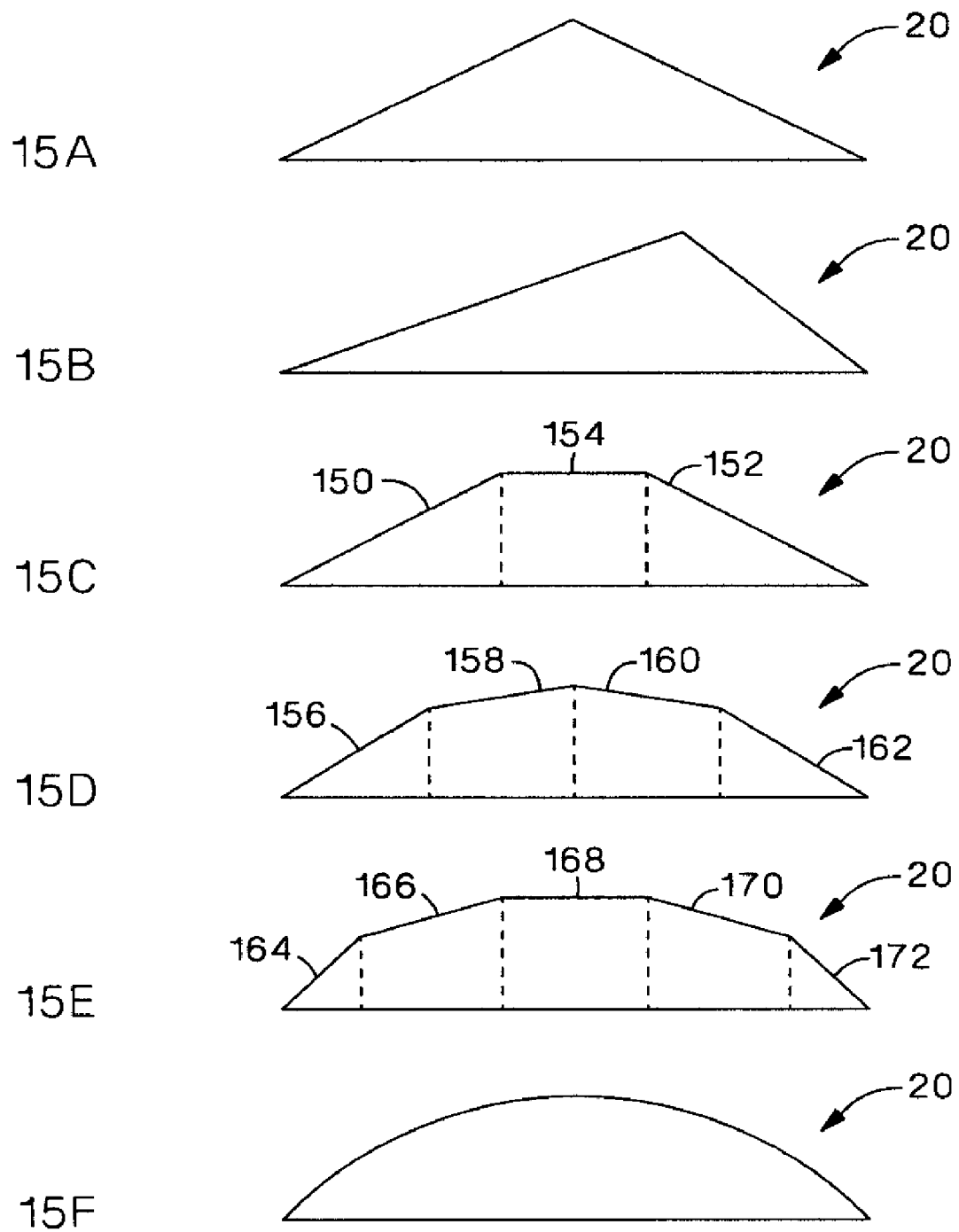
FIG. 15 is a top view of various embodiments of the cover plate shown in FIG. 1.

Since the cover plate 20 has a shape that is substantially the same as the area bounded by the longitudinal profile of the patch panel frame and the line extending between the longitudinal ends of the frame, cover plate 20 may have various different shapes depending on the longitudinal profile of the frame. FIG. 15 illustrates several possible shapes for cover plate 20. FIG. 15A shows a triangular shaped cover plate. The triangular shaped cover plate may be used to cover a triangular shaped angled patch panel. The triangular shaped cover plate may be a scalene triangle, such as the shape depicted in FIG. 15B. FIG. 15C shows a cover plate having two angled sections 150, 152 and a flat center section 154 joining the two angled sections. The cover plate depicted in FIG. 15C may be used to cover a similarly shaped angled patch panel having two angled sections and a flat center section.

The cover plate may have additional angled sections. For example, FIG. 15D shows a cover plate having four angled sections 156, 158, 160, 162. Alternatively, the cover plate may have four angled sections with a flat center section. FIG. 15E shows a cover plate with four angled sections 164, 166, 170, 172 and a flat center section 168. It should be understood that the sections described are joined together and form a continuous and substantially flat plate. Still alternatively, the cover plate may be generally round, such as the cover plate illustrated in FIG. 15F. It should be understood that in addition to these embodiments illustrated in FIG. 15, many other shapes for the cover plate are possible as well.

As shown in FIGS. 6-9, cover plate 20 is installed from rear side 42 of rack 24, so that cover plate 20 can be installed without having to first remove angled patch panel 22 from rack 24. The network rack has a front side 44 and a rear side 42. The angled patch panel 22 is mounted to the front side 44 of rack 24. The plate-mounting apertures 33, 35 of cover plate 20 may be connected to the rear side 42 of rack 24 opposite to the front side 44 where the angled patch panel 22 is mounted. When installed, the plate preferably extends beyond a line defined by the front side of the network and substantially covers angled patch panel 22. Since the cover plate is mounted to the rear side of the network rack that is opposite to the front side where the angled patch panel was mounted, mounting the cover plate does not require using additional space or additional mounting apertures 38, 40 on the network rack.

Moreover, because cover plate 20 is mounted from rear side 42 of rack 24, angled patch panel 22 will not experience any displacement that could potentially disrupt the profile on front side 44 of rack 24. If cover plate 20 was mounted to front side 44 of rack 24 behind patch panel 22, cover plate 20 would displace patch panel 22 outward from rack 24.

Figure 10:
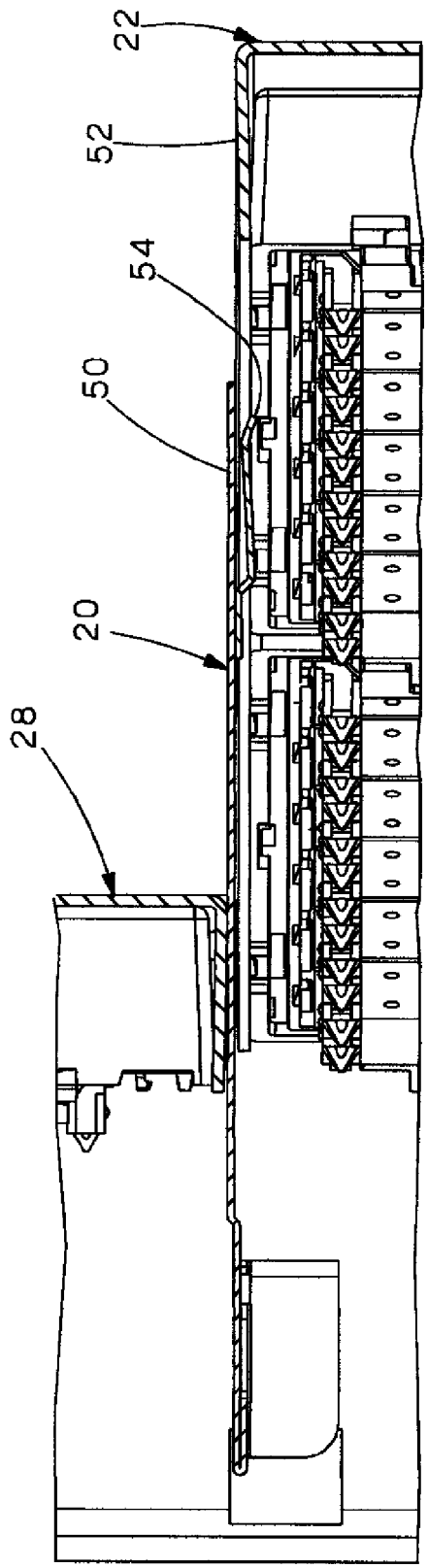
FIG. 10 is a cross-sectional view taken along lines 10-10 of FIG. 9.
Figure 11:
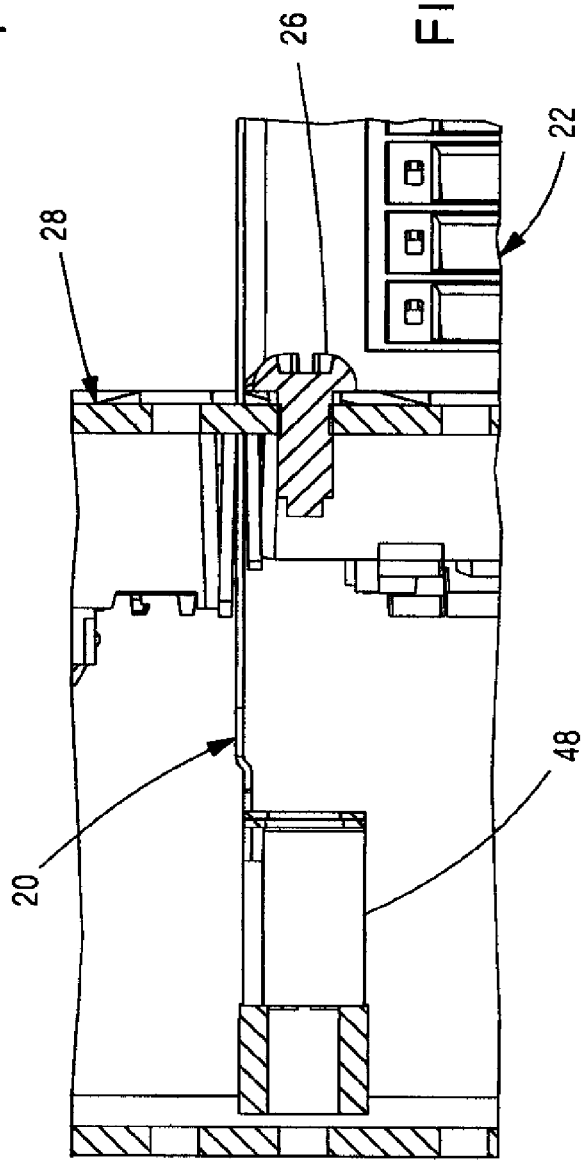
FIG. 11 is a cross-sectional view taken along lines 11-11 of FIG. 9.
Figure 12:
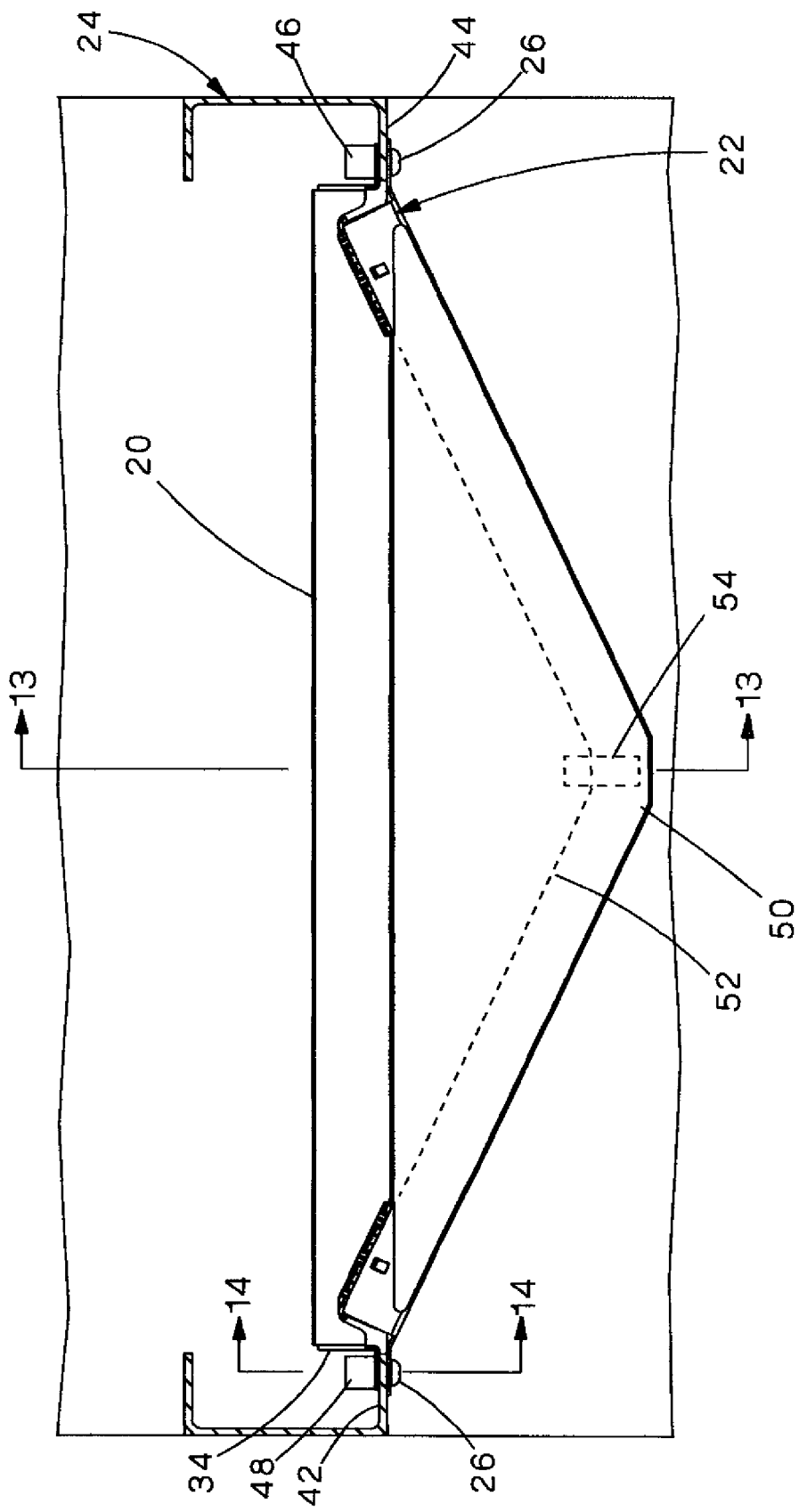
FIG. 12 is a cross-sectional view taken along lines 12-12 of FIG. 1, with the flat patch panel removed for clarity.
Figure 13:
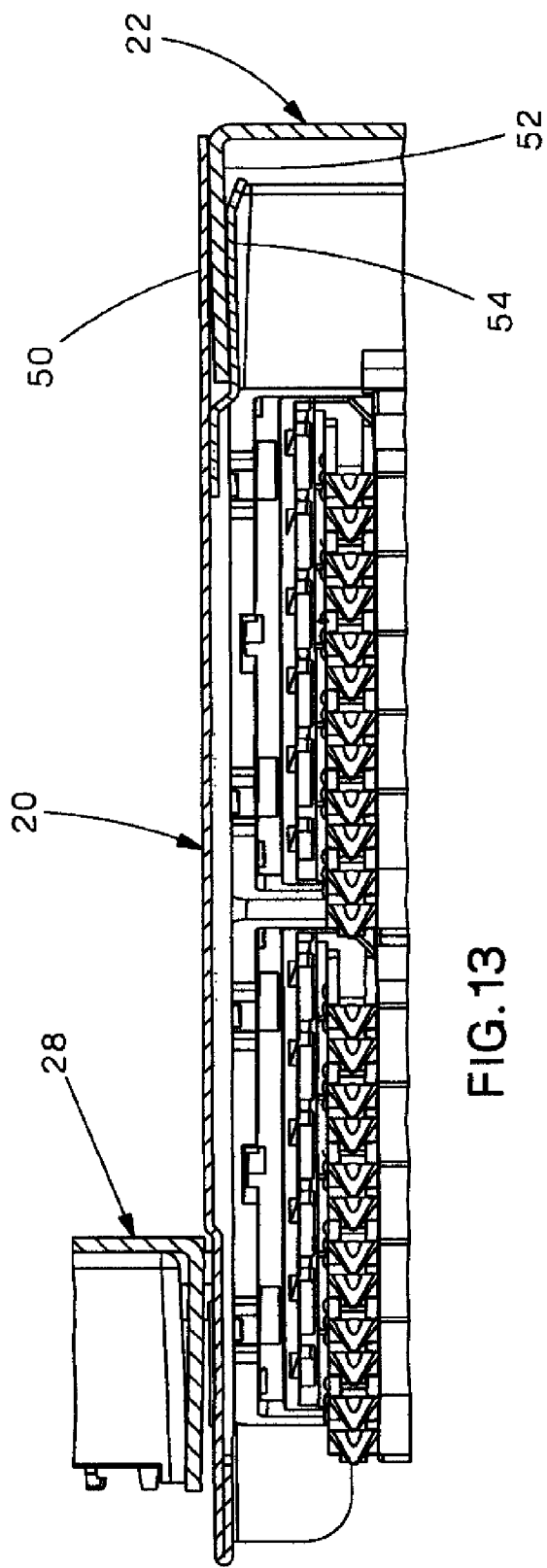
FIG. 13 is a cross-sectional view taken along lines 13-13 of FIG. 12.
Figure 14:
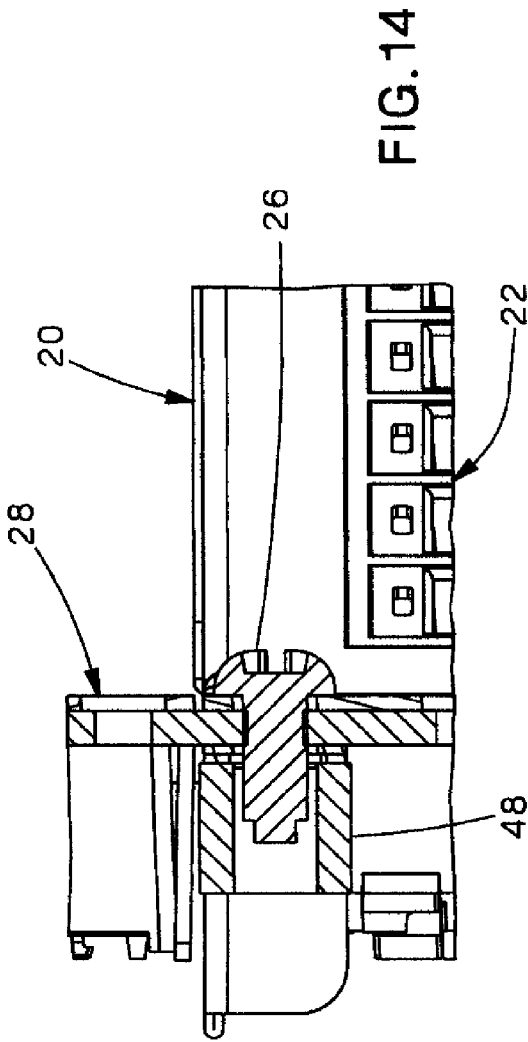
FIG. 14 is a cross-sectional view taken along lines 14-14 of FIG. 12.

In a preferred embodiment, plate 37 includes a clip that allows it to clip to the angled patch panel it covers. FIG. 10 is a cross-sectional view taken along lines 10-10 of FIG. 9. As shown in FIG. 10, cover plate 20 is pushed through rear side 42 of rack 24 over the top of angled patch panel 22 and below flat patch panel 28. As best seen in FIG. 13, apex 50 of cover plate 20 slides over top flange 52 of patch panel 22 and welded clip 54 slides underneath top flange 52. The welded clip and the top flange may have shapes complimentary to each other. When the cover plate is installed, mounting apertures 33, 35 pass over the top two screws 26 holding patch panel 22 to rack 24. When cover plate 20 is pushed into place, retaining spacers 46, 48 are pushed over screws 26 to secure cover plate 20 to rack 24, as shown in FIG. 14. Retaining spacers 46, 48 allow for easy installation as well as provide sufficient retention force.

Because cover plate 20 occupies zero rack units, cover plate 20 preferably is made of thin sheet metal. Other materials are possible as well. For instance, cover plate 20 may be made of plastic. In a preferred embodiment, the plate has a thickness in between the range of 0.015 inches to 0.075 inches. Further, the plate is preferably substantially flat. Strengthening features may be added to cover plate 20 to increase the strength in key locations, such as bends in rack mounting members 32, 34 to increase the strength and durability of cover plate 20. Moreover, an additional layer of material thickness may be added to other portions of cover plate 20 to provide increased stiffness.

As discussed in reference to FIG. 1, the cover plate has a shape substantially the same as the shape of area 35 and thus substantially covers area 35. However, in a preferred embodiment, the cover plate may cover an area defined differently than area 35 was defined. For example, cover plate 20 may be used to cover an angled patch panel such as angled patch panel 200 depicted in FIGS. 16 and 17. Angled patch panel 200 includes a frame 202 and mounting members 204, 206 on opposite longitudinal ends of frame 202. The mounting members may be used to mount angled patch panel 200 to a plurality of locations on a network rack, such as rack 24. When angled patch panel 200 is installed in a network rack, frame 202 has a foremost portion 208 extending away from the network rack. Angled patch panel 200 further has a rearmost portion 210 opposite the foremost portion. Frame 202 may have a longitudinal profile, at least a portion of which is angled with respect to the line defined by rearmost portion 210. Cover plate 20 may have an area substantially the same as the area 212 defined by the area bounded between the longitudinal profile and the line defined by the rearmost portion 210 of frame 202.

Figure 16:
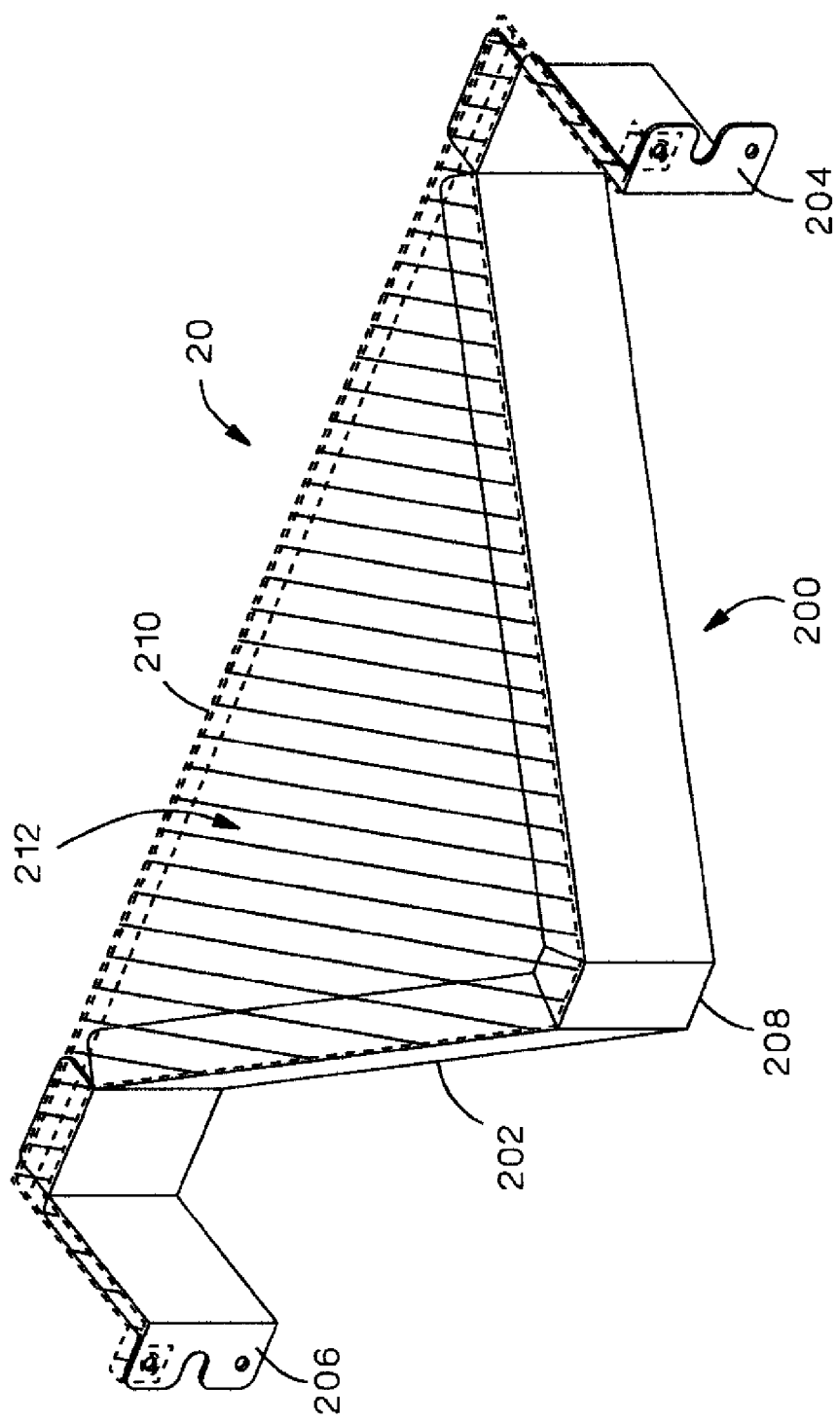
FIG. 16 is a top front perspective view of a cover plate according to the present invention.

The rearmost portion may extend into the network rack, as rearmost portion 210 of angled patch panel 200 would when mounted to a network rack, as depicted in FIG. 16. Alternatively, the rearmost portion of the angled patch panel may be even with the front face of the network rack, as the rearmost portion of angled patch panel 22 is in FIG. 1.

Figure 17:
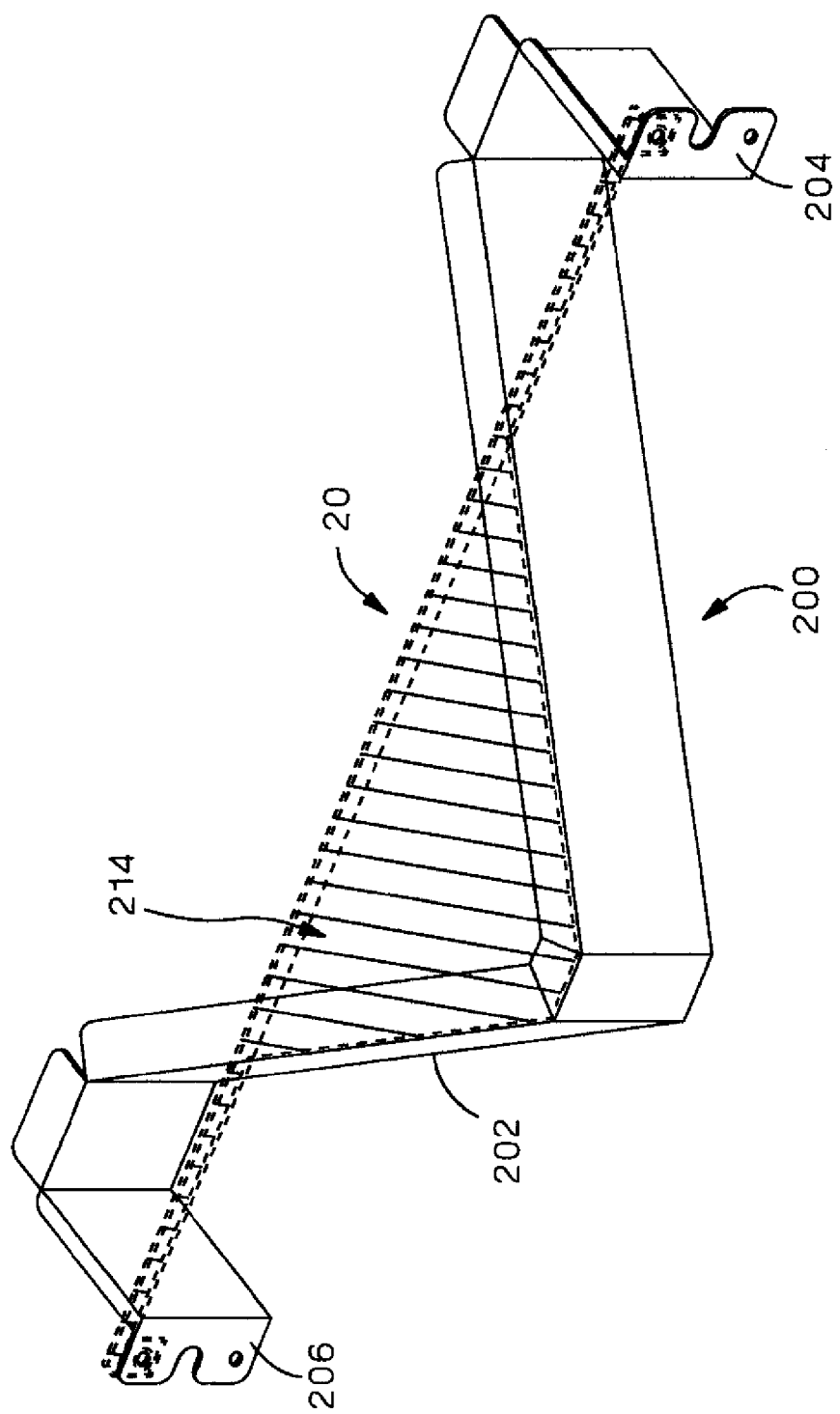
FIG. 17 is a top front perspective view of a cover plate according to the present invention.

Alternatively, as depicted in FIG. 17, frame 202 of angled patch panel 200 may have a longitudinal profile at least a portion of which is angled with respect to a line defined by mounting members 204, 206 of angled patch panel 200. Cover plate 20 may have an area substantially the same as the area 214 defined by the area bounded between the longitudinal profile and the line defined by the mounting members 204, 206 of angled patch panel 200, as shown in FIG. 17. Thus, in some embodiments of the present invention, it is not necessary that the cover plate covers the entire area defined by the frame of the angled patch panel.

Figure 18:
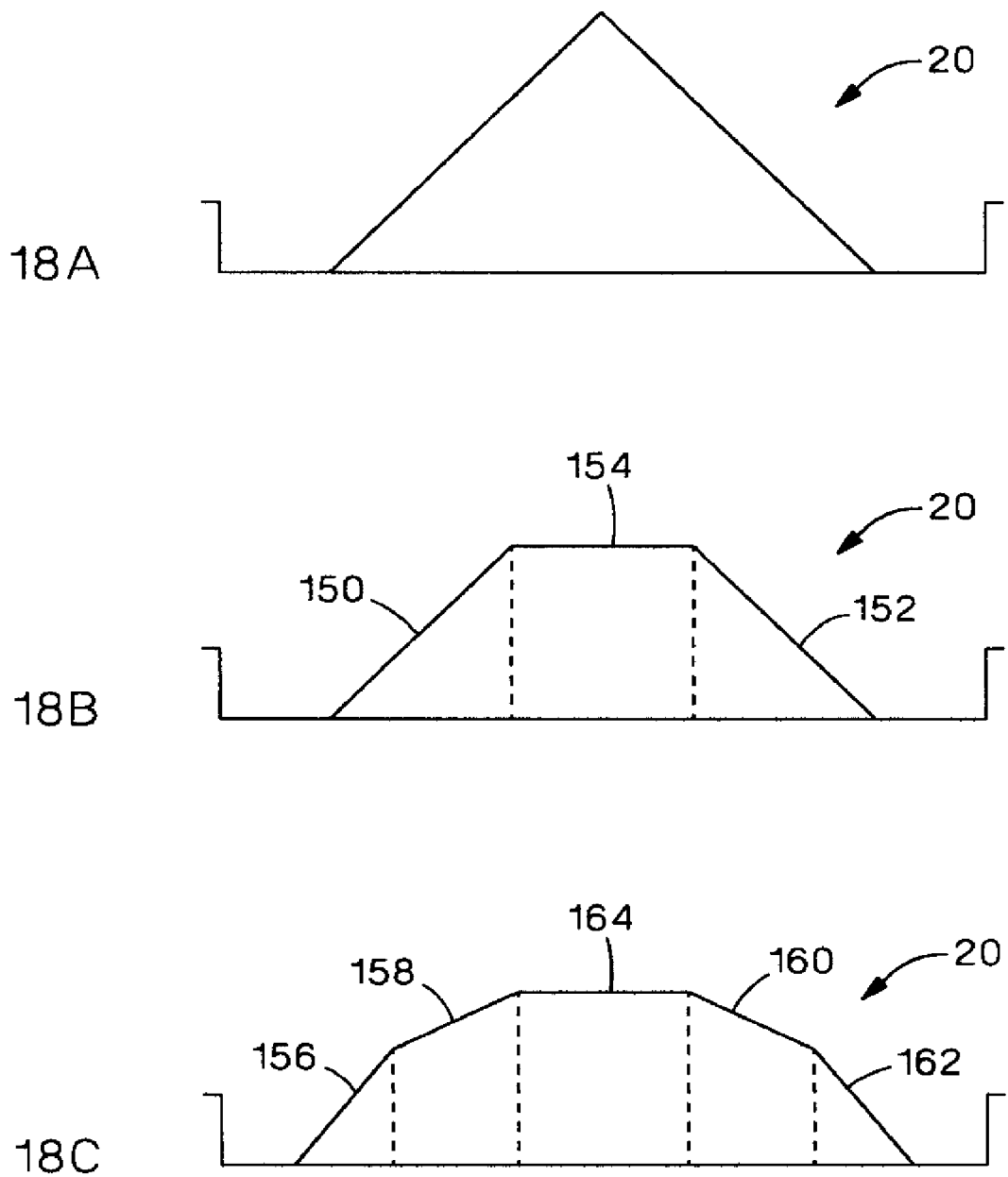
FIG. 18 is a top view of various embodiments of the cover plate shown in FIG. 16.

FIG. 18 illustrates several possibilities for the shape of cover plate 20 depicted in FIG. 16. FIG. 18A depicts a cover plate having a triangular shape. FIG. 18B shows a cover plate having two angled sections 150, 152 and a flat center section 154 joining the two angled sections. FIG. 18C shows a cover plate having four angled sections 156, 158, 160, 162 and a flat center section 164. It should be understood that in addition to these embodiments illustrated in FIG. 18, many other shapes for the cover plate are possible as well.

Advantageously, the cover plate for an angled patch panel described is a zero rack unit solution that protects otherwise exposed electrical connections and components, while not occupying valuable rack space. As best seen in FIG. 1, installing cover plate 20 above angled patch panel 22 provides an enclosed appearance by covering otherwise exposed cables and electrical connections. Thus, cover plate 20 helps keep dust and debris away from electrical connections and components. Moreover, cover plate 20 facilitates proper cooling of active equipment, such as switches or servers. Because cover plate 20 may occupy the area above and/or below angled patch panel 22, hot air exiting the active equipment is prevented from recirculating into the active equipment. Also, blocking the area around angled patch panel 22 ensures that any cool air will pass through the active equipment, instead of around the active equipment. Thus, cover plate 20 promotes optimal cooling of the active equipment.

While the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as a limitation. The illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

The invention claimed is:

1. A cover plate for an angled patch panel, wherein the angled patch panel has a frame having mounting members on opposite longitudinal ends of the frame, wherein the mounting members are for mounting the angled patch panel to a plurality of locations on a network rack, and wherein the frame has a longitudinal profile at least a portion of which is angled with respect to a line extending between the longitudinal ends of the frame to define an area bounded by the longitudinal profile and the line extending between the longitudinal ends of the frame, comprising:
   a plate having a shape substantially the same as the defined area; and
   a plurality of plate-mounting members to mount the plate at the plurality of locations on the network rack.

2. The cover plate for an angled patch panel of claim 1, wherein the plurality of locations at which the angled patch panel is mounted includes two locations and the plurality of locations at which the plate is mounted includes the same two locations.

3. The cover plate for an angled patch panel of claim 1, wherein the plurality of locations at which the angled patch panel is mounted includes four locations and the plurality of locations at which the plate is mounted includes two of the four locations.

4. The cover plate for an angled patch panel of claim 1, wherein the area is a substantially triangular shape.

5. The cover plate for an angled patch panel of claim 4, wherein the substantially triangular shape is a scalene triangle.

6. The cover plate for an angled patch panel of claim 1, wherein the area includes two angled sections with a flat center section joining them.

7. The cover plate for an angled patch panel of claim 6, wherein the two angled sections have a substantially similar angle.

8. The cover plate for an angled patch panel of claim 1, wherein the area includes a plurality of angled sections, wherein adjacent angled sections are joined together.

9. The cover plate for an angled patch panel of claim 1, wherein the area is generally round.

10. The cover plate for an angled patch panel of claim 1, wherein the plate comprises a clip located at the bottom side of the plate, wherein the clip is capable of engagement with the angled patch panel.

11. The cover plate for an angled patch panel of claim 1, wherein the thickness of the plate is in the range of 0.015 inches to 0.075 inches.

12. A cover plate for an angled patch panel, wherein the angled patch panel has a frame and mounting members on opposite longitudinal ends of the frame, wherein the mounting members are for mounting the angled patch panel to a plurality of locations on the network rack, wherein when the angled patch panel is installed in a network rack the frame has a foremost portion extending away from the network rack and a rearmost portion opposite the foremost portion, wherein the frame has a longitudinal profile at least a portion of which is angled with respect to a line defined by the rearmost portion of the frame, and wherein an area is defined by the longitudinal profile and the line defined by the rearmost portion of the frame, comprising:
 a plate having a shape substantially the same as the defined area; and
 a plurality of plate-mounting members to mount the plate at the plurality of locations on the network rack.

13. The cover plate for an angled patch panel of claim 12, wherein the rearmost portion is even with a front face of the network rack.

14. The cover plate for an angled patch panel of claim 12, wherein the rearmost portion extends into the network rack.

15. The cover plate for an angled patch panel of claim 12, wherein the area is a substantially triangular shape.

16. The cover plate for an angled patch panel of claim 12, wherein the area includes two angled sections with a flat center section joining them.

17. The cover plate for an angled patch panel of claim 12, wherein the area includes a plurality of angled sections, wherein adjacent angled sections are joined together.

18. A cover plate for an angled patch panel, wherein the angled patch panel has a frame having mounting members on opposite longitudinal ends of the frame, wherein the mounting members are for mounting the angled patch panel to a plurality of locations on the network rack, wherein the network rack has a front face, wherein the frame has a longitudinal profile at least a portion of which is angled with respect to a line defined by the front face of the network rack, and wherein an area is defined by the longitudinal profile and the line defined by the front face of the network rack, comprising:
 a plate having a shape substantially the same as the defined area; and
 a plurality of plate-mounting members to mount the plate at the plurality of locations on the network rack.

19. The cover plate for an angled patch panel of claim 18, wherein the area is a substantially triangular shape.

20. A cover plate for an angled patch panel for installation onto a network rack, wherein the network rack comprises two rails spaced a predetermined distance from each other, each rail including spaced mounting openings, wherein the network rack further comprises a front side and a rear side, wherein the angled patch panel is mounted to the front side of the network rack, the cover plate for the angled patch panel comprising:
 a plate, wherein the plate has an angled profile, wherein at least a portion of the angled profile is angled with respect to a line extending between the two rails of the network rack; and
 rack mounting members provided on opposite longitudinal ends of the plate, wherein each rack mounting member includes a mounting aperture, wherein the mounting members are mounted to a rear side of the network rack and opposite to the front side of the network rack where the angled patch panel is mounted, wherein the plate extends beyond a line defined by the front side of the network rack when mounted, and wherein the plate substantially overlaps the angled patch panel when mounted to the front side of the network rack.

21. The cover plate for an angled patch panel of claim 20, wherein the angled profile is a substantially triangular shape.

22. The cover plate for an angled patch panel of claim 20, wherein the angled profile includes two angled sections with a flat center joining them.

23. The cover plate for an angled patch panel of claim 20, wherein the angled profile includes a plurality of angled sections and at least one flat section, wherein, when an angled section is adjacent to another angled section, the angled sections are joined together, and when an angled section is adjacent the at least one flat section, the angled section and the flat section are joined together.

24. The cover plate for an angled patch panel of claim 20, wherein the angled profile includes a plurality of angled sections, wherein adjacent angled sections are joined together.

25. The cover plate for an angled patch panel of claim 20, wherein the angled profile is generally round.

26. The cover plate for an angled patch panel of claim 20, wherein the angled patch panel has an angled profile, and wherein the angled profile of the plate has a shape that is substantially the same as the shape of the angled profile of the angled patch panel.

27. The cover plate for an angled patch panel of claim 20, wherein the plate is substantially flat.

28. The cover plate for an angled patch panel of claim 20, wherein the cover plate is metal.

29. The cover plate for an angled patch panel of claim 28, wherein the thickness of the plate is in the range of 0.015 inches to 0.075 inches.

30. The cover plate for an angled patch panel of claim 20, wherein the cover plate is plastic.

31. The cover plate for an angled patch panel of claim 20, wherein the bottom of the plate comprises a clip, wherein the clip is capable of engagement with the angled patch panel.

32. A network rack assembly, comprising:
 a network rack, wherein the network rack has a front side and a rear side;
 an angled patch panel mounted to the front side of the network rack; and
 an angled patch panel cover plate, wherein the angled patch panel cover plate comprises:
 a plate, wherein the plate has an angled profile, wherein at least a portion of the angled profile is angled with respect to a line defined by the front side of the network rack; and
 rack mounting members provided on opposite longitudinal ends of the plate, wherein each rack mounting member includes a mounting aperture, wherein the mounting members are connected to the rear side of the network rack and opposite to the front side of the network rack where the angled patch panel is mounted, wherein the plate extends beyond a line defined by the front side of the network rack, and wherein the plate substantially overlaps the angled patch panel mounted to the front side of the network rack.

33. The network rack of claim 32, wherein the angled patch panel has an angled profile, wherein the angled profile is angled with respect to a line defined by the front of the network rack, and wherein the angled profile of the plate has a shape substantially similar to the shape of the angled profile of the angled patch panel.

34. The network rack of claim 33, wherein the angled profile of the plate is a substantially triangular shape.

35. The network rack of claim 32, wherein the plate is substantially flat.

36. The network rack of claim 32, wherein the angled patch panel is mounted to the front side of the network rack with screws, wherein the screws extend beyond the rear side of the network rack and through the mounting apertures of the cover plate, the network rack further comprising retaining spacers, wherein the retaining spacers are positioned over the screws to secure the cover plate to the rear side of the network rack.

37. The network rack of claim 32, wherein the bottom of the plate comprises a clip, wherein the clip is capable of engagement with the angled patch panel.

38. The network rack of claim 37, wherein the angled patch panel comprises a top flange, wherein the clip and the top flange have shapes complimentary to each other.

39. The network rack assembly of claim 32, wherein the angled patch panel has a top side, wherein the angled patch panel cover plate overlaps the top side of the angled patch panel.

40. The network rack assembly of claim 32, wherein the angled patch panel has a bottom side, and wherein the angled patch panel cover plate overlaps the bottom side of the angled patch panel.

41. The network rack of claim 32, wherein the plate has a thickness in the range of 0.015 inches to 0.075 inches.

42. The network rack assembly of claim 32, wherein the network rack is a telecommunications equipment rack.

\* \* \* \* \*